United States Patent
Konishi et al.

Patent Number: 6,092,164
Date of Patent: *Jul. 18, 2000

[54] MICROCOMPUTER HAVING DIVISION OF TIMING SIGNALS TO INITIALIZE FLASH MEMORY

[75] Inventors: Masayuki Konishi; Nobuhiko Tanaka, both of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/899,307

[22] Filed: Jul. 23, 1997

[30] Foreign Application Priority Data

Mar. 13, 1997 [JP] Japan ................................. 9-059677

[51] Int. Cl.[7] ................................................ G06F 9/312
[52] U.S. Cl. ...................... 711/166; 711/103; 365/218; 365/236; 365/185.29; 365/185.33
[58] Field of Search ................................. 711/166, 170, 711/103, 101, 219; 365/218, 236, 185.29, 185.33

[56] References Cited

U.S. PATENT DOCUMENTS

| | | | |
|---|---|---|---|
| 5,327,531 | 7/1994 | Bealkowski et al. | 364/268 |
| 5,414,829 | 5/1995 | Fandrich et al. | 711/101 |
| 5,490,109 | 2/1996 | Salmon | 365/185.17 |
| 5,732,092 | 3/1998 | Shinohara | 714/773 |
| 5,734,816 | 3/1998 | Niijima et al. | 365/185.29 |

FOREIGN PATENT DOCUMENTS

| | | |
|---|---|---|
| 2-9090 | 1/1990 | Japan . |
| 3-238697 | 10/1991 | Japan . |
| 5-266220 | 10/1993 | Japan . |
| 6-52694 | 2/1994 | Japan . |

OTHER PUBLICATIONS

"94 Mitsubishi Denki Semiconductor Data book" published by Mitsubishi Electric Corporation, 1994.

Primary Examiner—B. James Peikari
Attorney, Agent, or Firm—Burns, Doane, Swecker & Mathis, LLP

[57] ABSTRACT

A microcomputer comprising a CPU for outputting a signal requesting generation of pulses when receiving an erase signal requesting processing to initialize a flash memory unit; a timer for generating the pulses when receiving the signal requesting generation of the pulses output by the CPU wherein the frequency of a system clock is divided to produce clock pulses and each of the pulses is generated whenever the number of clock pulses reaches a set value; and a memory control unit for executing the processing to initialize the flash memory unit as well as measuring a time it takes to carry out the processing by counting the number of pulses output by the timer when receiving the erase signal.

16 Claims, 5 Drawing Sheets

MICROCOMPUTER HAVING DIVISION OF TIMING SIGNALS TO INITIALIZE FLASH MEMORY

BACKGROUND OF THE INVENTION

1. Field of the Invention

The present invention relates to a microcomputer capable of measuring a time it takes to carry out processing to initialize a flash memory.

2. Description of the Prior Art

FIG. 7 is a diagram showing the configuration of a conventional microcomputer shown for example on page 4-4 of a memory ROM chapter of a '94 Mitsubishi Semiconductor Data Book' published by Mitsubishi Electric Corporation in January 1994. Reference numerals 1 and 2 shown in the figure are a microcomputer and a flash-memory unit embedded in the microcomputer 1 respectively. Reference numeral 3 denotes a timer for outputting a clock signal having a predetermined frequency which is obtained by dividing the frequency of a system clock. Reference numeral 4 is a CPU which operates in synchronization with the clock signal generated by the timer 3. The CPU 4 outputs an initialization instruction when it receives an erase signal requesting processing to initialize the flash memory unit 2. Reference numeral 5 is a memory control unit which is used for executing the processing to initialize the flash memory unit 2 when an initialization instruction is received from the CPU 4. While the processing to initialize the flash memory unit 2 is being carried out from its start to an end thereof, the memory control unit 5 outputs a busy signal for indicating that the initialization is under way. Reference numeral 6 is a timer embedded in the memory control unit 5 for outputting a pulse signal while the busy signal output by the memory control unit 5 is active. Reference numeral 7 is a measurement apparatus for measuring the time it takes to carry out the processing to initialize the flash memory unit 2 by counting the number of pulses in the pulse signal generated by the embedded timer 6.

First of all, when an erase signal is received by the CPU 4 typically by way of an external input pin of the microcomputer 1, the CPU 4 outputs an initialization instruction to the memory control unit 5, requesting the memory control unit 5 to execute processing to initialize the flash memory unit 2.

Receiving the initialization instruction from the CPU 4, the memory control unit 5 executes the processing to initialize the flash memory unit 2. The time it takes to carry out the processing to initialize the flash memory unit 2 is measured as an item of evaluation of the flash memory unit 2. As described above, while the processing to initialize the flash memory unit 2 is being carried out from its start to an end thereof, the memory control unit 5 outputs a busy signal for indicating that the initialization is under way.

In addition, the timer 6 embedded in the memory control unit 5 outputs a pulse signal while the busy signal output by the memory control unit 5 is active.

In the mean time, the measurement apparatus 7 connected to an external pin of the microcomputer 1 measures the time it takes to carry out the processing to initialize the flash memory unit 2 by counting the number of pulses in the pulse signal generated by the embedded timer 6.

Having a configuration described above, the conventional microcomputer 1 allows the time it takes to carry out processing to initialize the memory flash unit 2 embedded therein to be measured. However, it is necessary to prepare the dedicated measurement apparatus 7, giving rise to a problem that the flash memory unit 2 can not be evaluated with ease.

Moreover, in addition to the timer 3, it is also necessary to provide separately the embedded timer 6 for outputting a pulse signal with a predetermined frequency, raising another problem that the configuration of the circuit becomes complex.

It should be noted that, in place of the embedded timer 6, a technology of utilizing a system clock is disclosed in JP-A No. Hei 2-9090. Even if this technology allows the embedded timer 6 to be eliminated, the dedicated measurement apparatus 7 is still required. In addition, the frequency of the system clock is very high, giving rise to a still further problem that it is necessary to provide the measurement apparatus 7 with a counting circuit that is capable of counting the number of clock pulses in the system clock at a high speed.

SUMMARY OF THE INVENTION

The present invention addresses the problems described above. It is thus an object of the present invention to provide a microcomputer that allows a memory flash unit embedded therein to be evaluated with ease and the circuit configuration of the memory control unit thereof to be made simple.

According to an aspect of the present invention, there is provided a microcomputer wherein, when an erase signal is received, the time it takes to carry out processing to initialize a flash memory unit embedded in the microcomputer is measured by the memory control unit by counting the number of pulses in a pulse signal generated by a timer. Each of the pulses is output by the timer whenever the number of clock pulses in the system clock reaches a set value. For this reason, a time it takes to carry out processing to initialize the flash memory unit can be measured without the need to connect an external dedicated measurement apparatus to the microcomputer, resulting in an effect that the memory flash unit can be evaluated with ease. In addition, since it is not necessary to provide a timer embedded in the memory control unit, the microcomputer exhibits another effect that the circuit configuration of the memory control unit can be made simple.

In addition, according to another aspect of the present invention, there is provided a microcomputer wherein, when an erase signal is received, a signal requesting generation of pulses is output by the memory control unit to the timer. Receiving the signal requesting generation of pulses, the timer generates a pulse whenever the number of clock pulses in the system clock reaches a set value. The number of pulses generated by the timer is then counted by the memory control unit in order to measure the time it takes to carry out processing to initialize the flash memory unit. As a result, even if the CPU happens to be in an unavailable state when the erase signal to initiate the processing to initialize the flash memory unit is received, the timer can be activated with a high degree of reliability. That is to say, even in such a case, the microcomputer exhibits an effect that the memory flash unit can be evaluated with ease and that the circuit configuration of the memory control unit can be made simple.

Furthermore, according to a still further aspect of the present invention, there is provided a microcomputer wherein, when the CPU outputs a signal requesting generation of pulses to the timer, the time it takes to carry out processing to initialize the flash memory unit is measured by the timer by counting the number of pulses generated therein as long as a busy signal output by the memory control unit is active. In the timer, the frequency of the system clock is divided so that each of the pulses is generated only when the number of clock pulses in the system clock reaches a set value. As a result, the time it takes to carry out processing to initialize a flash memory unit can be measured without the need to connect an external dedicated measurement apparatus to the microcomputer, resulting in an effect that the memory flash unit can be evaluated with ease. In addition, since it is not necessary to provide a timer embedded in the memory control unit, the microcomputer exhibits another effect that the circuit configuration of the memory control unit can be made simple.

In addition, according to a still further aspect of the present invention, there is provided a microcomputer wherein, when a signal requesting generation of pulses is received by the timer from the memory control unit, the time it takes to carry out processing to initialize the flash memory unit is measured by the timer by counting the number of pulses generate therein as long as a busy signal output by the memory control unit is active. In the timer, the frequency of the system clock is divided so that each of the pulses is generated only when the number of clock pulses in the system clock reaches a set value. As a result, even if the CPU happens to be in an unavailable state when an erase signal to initiate the processing to initialize the flash memory unit is received, the timer can be activated with a high degree of reliability. That is to say, the microcomputer exhibits an effect that the memory flash unit can be evaluated with ease and that the circuit configuration of the memory control unit can be made simple.

Furthermore, according to a still further aspect of the present invention, there is provided a microcomputer wherein, determining is started from a predetermined reload value in a timer register in synchronization with the system clock. As an underflow occurs in the timer register, a pulse is generated and the determining is resumed from the predetermined reload value. As a result, the microcomputer provided by the present invention exhibits an effect that the time it takes to carry out processing to initialize the flash memory unit can be measured without the need to provide the memory control unit with a counting circuit that is capable of counting the number of clock pulses in the system clock at a high speed.

In addition, according to a still further aspect of the present invention, there is provided a microcomputer wherein, incrementing is started from a predetermined reload value in a timer register in synchronization with the system clock. As an overflow occurs in the timer register, a pulse is generated and the incrementing is resumed from the predetermined reload value. As a result, the microcomputer provided by the present invention exhibits an effect that the time it takes to carry out processing to initialize the flash memory unit can be measured without the need to provide the memory control unit with a counting circuit that is capable of counting the number of clock pulses in the system clock at a high speed.

Furthermore, according to a still further aspect of the present invention, there is provided a microcomputer wherein, when an instruction to change a reload value is received, the memory control unit changes a reload value set in the timer. As a result, the microcomputer exhibits an effect that the frequency of the pulse signal generated by the timer can be modified appropriately in accordance with the accuracy required in the evaluation of the flash memory unit.

In addition, according to a still further aspect of the present invention, there is provided a microcomputer wherein, when an instruction to change a reload value is received, the CPU changes a reload value set in the timer. As a result, the microcomputer exhibits an effect that the frequency of the pulse signal generated by the timer can be modified appropriately in accordance with the accuracy required in the evaluation of the flash memory unit.

BRIEF DESCRIPTION OF THE DRAWINGS

Preferred embodiments of the present invention will be described with reference to figures showing the embodiments wherein.

DETAILED DESCRIPTION OF THE PREFERRED EMBODIMENTS

The present invention will become more apparent from the following detailed description of some preferred embodiments with reference to the accompanying diagrams showing the embodiments.

First Embodiment

Figure 1:
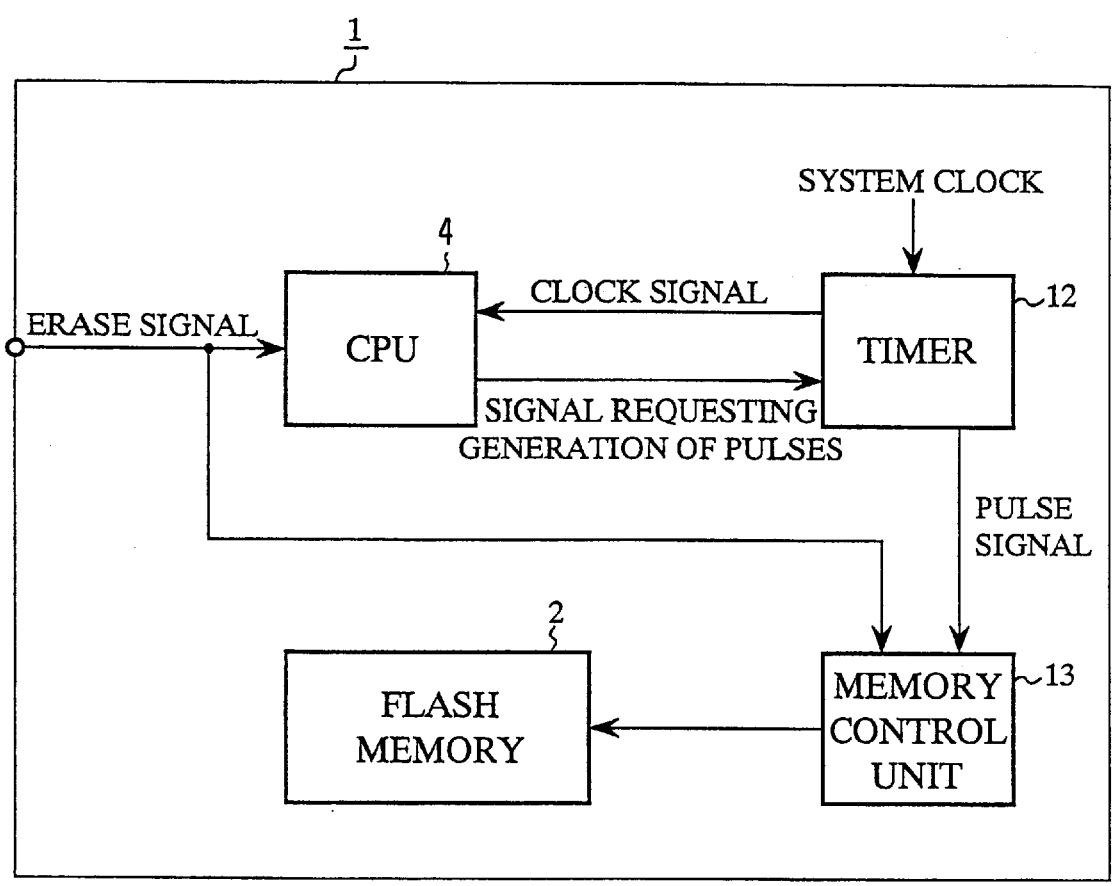
FIG. 1 is a block diagram showing the configuration of a microcomputer as implemented by a first embodiment.

FIG. 1 is a block diagram showing the configuration of a microcomputer as implemented in a first embodiment. Reference numerals 1 and 2 shown in the figure are a microcomputer and a flash-memory unit embedded in the microcomputer 1 respectively. Reference numeral 11 denotes a CPU which outputs a signal requesting generation of pulses when an erase signal requesting processing to initialize the flash memory unit 2 is received. Reference numeral 12 is a timer for providing the CPU 11 with a clock signal which is obtained by dividing the frequency of a system clock. The timer 12 is also used for generating a pulse each time the number of clock pulses in the system clock reach a set value in response to a signal requesting generation of pulses received from the CPU 11. Reference numeral 13 is a memory control unit which is used for executing the processing to initialize the flash memory unit 2 and for measuring the time it takes to carry out the processing to initialize the flash memory unit 2 by counting the number of pulses supplied by the timer 12 when the erase signal is received.

First of all, when an erase signal is received by the CPU 11 typically by way of an external input pin of the microcomputer 1, the CPU 11 outputs a signal requesting generation of pulses to the timer 12. In response to the signal requesting generation of pulses, the timer 12 generates a pulse signal required in processing to initialize the flash memory unit 2 to be described later.

To put it in detail, in response to the signal requesting generation of pulses received from the CPU 11, the timer 12 generates a pulse each time the number of clock pulses in the system clock reaches a set value.

Figure 2:
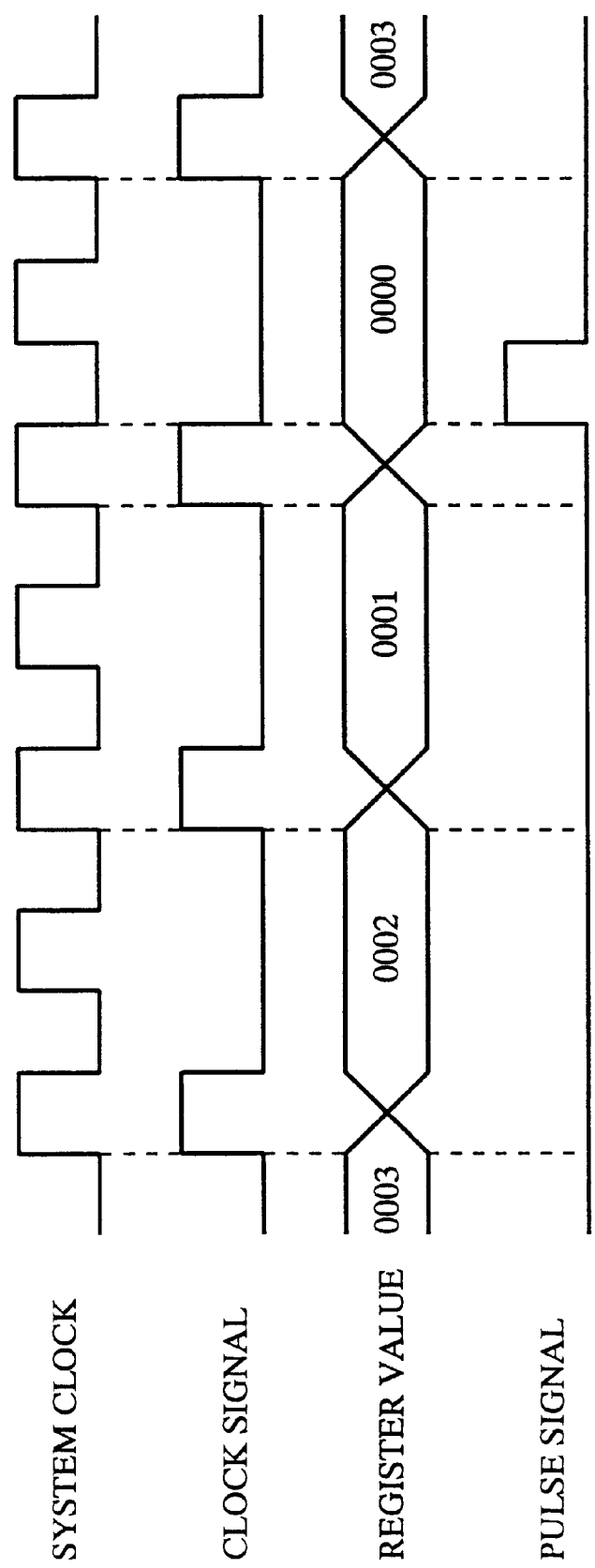
FIG. 2 shows timing charts used for explaining the operations of a timer employed in the microcomputer shown in FIG. 1.

Concretely speaking, the frequency of the system clock is divided in order to generate a clock signal as shown in FIG. 2. At the same time, decrementing is started from a predetermined reload value in synchronization with the clock signal. In the case of the time chart shown in FIG. 2, the reload value is set at 0003. It should be noted that the reload value is set in a register of the timer 12 typically at the time the CPU 11 outputs the signal requesting generation of pulses. In addition, when the CPU 11 receives an instruction to modify the reload value, the reload value set in the register of the timer 12 is changed.

As an underflow occurs in the register, that is, as the contents of the register become equal to 0000, a pulse is generated to the memory control unit 13 and the decrementing is resumed from the predetermined reload value.

In the case of the example shown in FIG. 2, the timer 12 generates a pulse each time eight system clock pulses are received. The reason why a pulse signal is supplied to the memory control unit 13 in place of the system clock is that the frequency of the system clock is very high. By using the pulse signal instead of the system clock, a measurement circuit capable counting the number of clock pulses in the system clock at a high speed is not required, allowing the circuit configuration of the memory control circuit 13 to be made simple.

When an erase signal is received, the memory control unit 13 starts processing to initialize the flash memory unit 2 and, at the same time, counts the number of pulses output by the timer 12 until the end of the initialization processing in order to measure the time it takes to carry out processing to initialize the flash memory unit. The time it takes to carry out processing to initialize the flash memory unit is given by the following equation:

Measurement time=(Period of pulse signal)×(Pulse Count)

As is obvious from the description given above, according to the first embodiment, when an erase signal is received, the memory control unit counts the number of pulses which are each output by the timer 12 every time the number of clock pulses in the system clock reaches a set value, resulting in an effect that the time it takes to carry out processing to initialize the flash memory unit 2 can be measured without the need to connect a dedicated external measurement apparatus to the microcomputer 1 and that the flash memory unit 2 can be evaluated with ease. In addition, the microcomputer 1 also exhibits an effect that it is not necessary to provide a timer embedded in the memory control unit 13 any more and the circuit configuration of the memory control unit 13 can thus be made simple.

Second Embodiment

Figure 3:
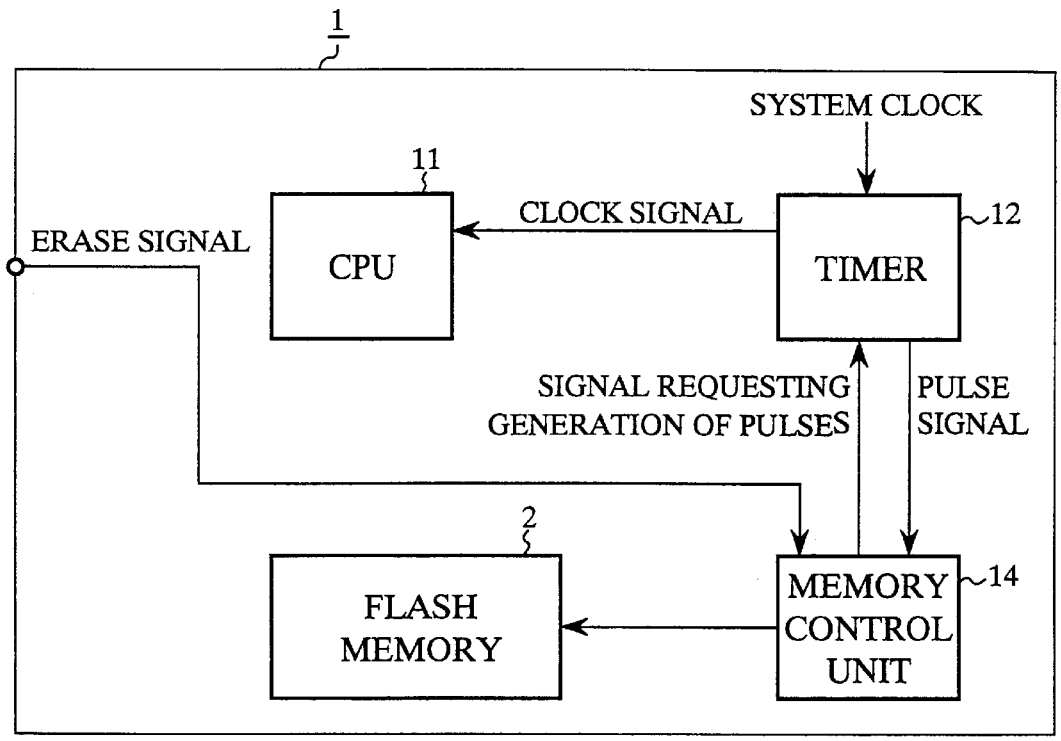
FIG. 3 is a block diagram showing the configuration of a microcomputer as implemented by a second embodiment.

FIG. 3 is a block diagram showing the configuration of a microcomputer as implemented by a second embodiment. Components identical with or equivalent to those shown in FIG. 1 are denoted by the same reference numerals as those shown in FIG. 1 and their explanation is omitted.

Reference numeral 14 is a memory control unit for executing processing to initialize the flash memory unit 2 and measuring the time it takes to carry out the processing by counting the number of pulses which are output by the timer 12 after a signal requesting generation of the pulses is output by the memory control unit 14 to the timer 12 in response to a received erase signal requesting the processing.

In the case of the first embodiment described above, when the CPU 11 receives an erase signal, a signal requesting generation of pulses is output to the timer 12 by the CPU 11 itself. It should be noted, however, that a signal requesting generation of pulses can be output to the timer 12 by the memory control unit 14, instead of the CPU 11, when the memory control unit 14 receives an erase signal as is the case with the second embodiment.

As a result, even in the case of a system wherein the CPU 11 happens to be in an unavailable state when an erase signal to initiate processing to initialize the flash memory unit 2 is received, the microcomputer 1 exhibits an effect that the timer 12 can be activated with a high degree of reliability. It is worth noting that, in the case of the second embodiment, it is also the memory control unit 14 that sets and changes the reload value in the timer 12.

Third Embodiment

Figure 4:
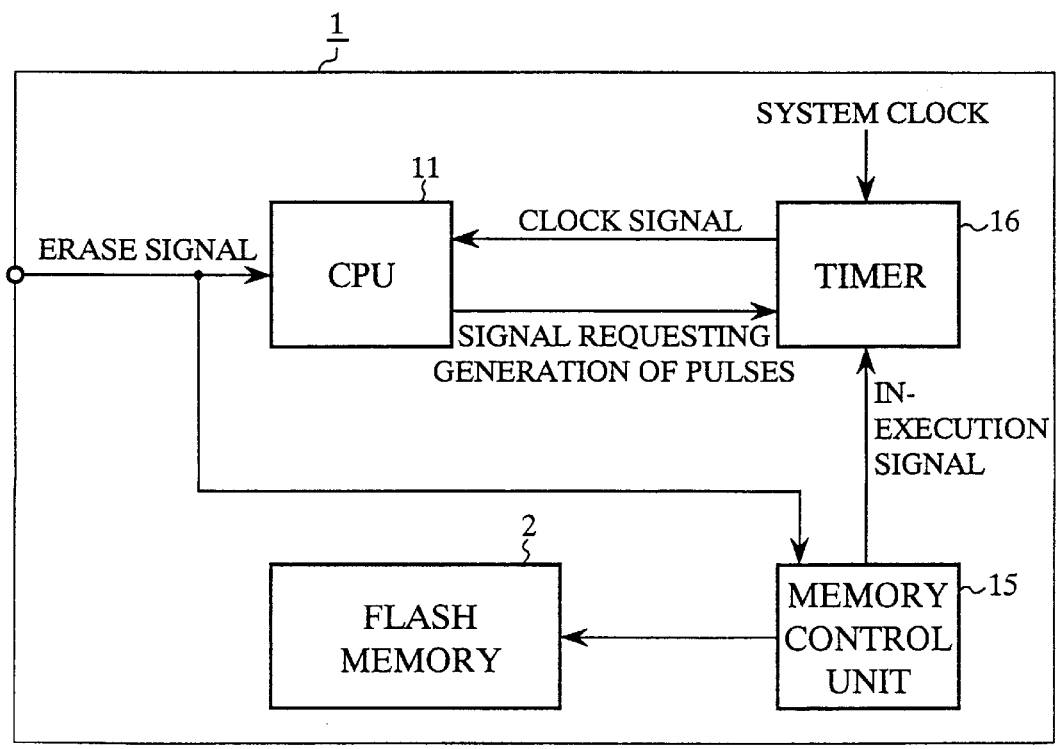
FIG. 4 is a block diagram showing the configuration of a microcomputer as implemented by a third embodiment.

FIG. 4 is a block diagram showing the configuration of a microcomputer as implemented by a third embodiment. Components identical with or equivalent to those shown in FIG. 1 are denoted by the same reference numerals as those shown in FIG. 1 and their explanation is omitted.

Reference numeral 15 is a memory control unit for executing processing to initialize the flash memory unit 2. While the processing to initialize the flash memory unit 2 is under way, the memory control unit 15 outputs a busy signal to indicate that the processing is going on. Reference numeral 16 is a timer for dividing the frequency of the system clock in order to supply a clock signal to the CPU 11. The timer 16 also measures a time it takes to carry out the processing to initialize the flash memory unit 2 by counting the number of pulses, which are each generated by the timer 16 every time the number of clock pulses in the system clock reaches a set value, when a signal requesting generation of the pulses is output by the CPU 11 as long as the busy signal output by the memory control unit 15 is active.

In the case of the first embodiment described above, it is the memory control unit 13 that measures the time it takes to carry out the processing to initialize the flash memory unit 2 by counting the number of pulses output by the timer 12. In the case of the third embodiment, on the other hand, it is the timer 16 that measures the time it takes to carry out the processing to initialize the flash memory unit 2 by counting the number of pulses each generated by the timer 15 every time the number of clock pulses in the system clock reaches a set value as long as the busy signal output by the memory control unit 15 is active to result in the same effect as the first embodiment.

Fourth Embodiment

Figure 5:
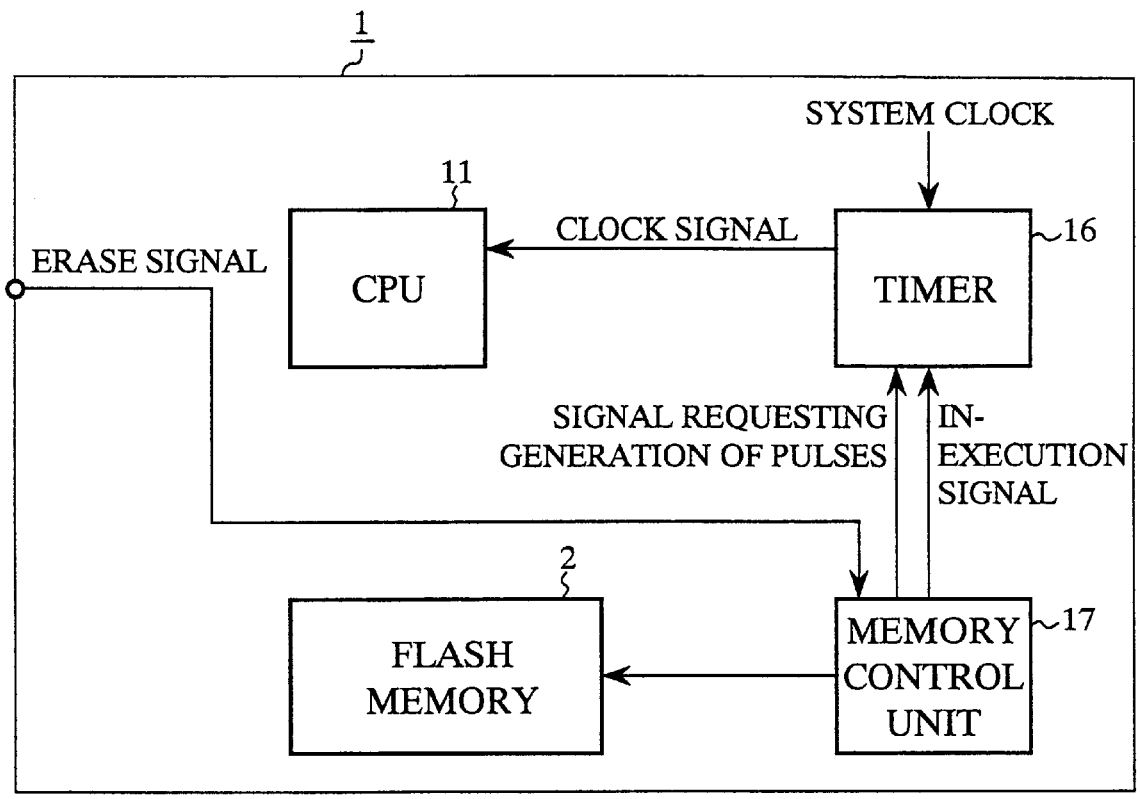
FIG. 5 is a block diagram showing the configuration of a microcomputer as implemented by a fourth embodiment.

FIG. 5 is a block diagram showing the configuration of a microcomputer as implemented by a fourth embodiment. Components identical with or equivalent to those shown in FIG. 4 are denoted by the same reference numerals as those shown in FIG. 4 and their explanation is omitted.

Reference numeral 17 is a memory control unit which is used for executing processing to initialize the flash memory unit 2 and for outputting a busy signal to indicate that the processing is under way while the processing is going on after a signal requesting generation of the pulses is output by the memory control unit 17 to the timer 16 in response to a received erase signal requesting the processing.

In the case of the third embodiment described above, when the CPU 11 receives an erase signal, a signal requesting generation of pulses is output to the timer 16 by the CPU 11 itself. In the case of the fourth embodiment, on the other hand, it is the memory control unit 17 that receives an erase signal and outputs a signal requesting generation of the pulses to the timer 16 in response to the erase signal.

As a result, even in the case of a system wherein the CPU 11 happens to be in an unavailable state when an erase signal to initiate the processing to initialize the flash memory unit 2 is received, the microcomputer 1 exhibits an effect that the timer 16 can be activated with a high degree of reliability and that a reload value can be set in the timer 16. It is worth noting that, in the case of the fourth embodiment, it is also the memory control unit 17 that sets and changes the reload value in the timer 16.

As described above, in the first to fourth embodiments, decrementing from a predetermined reload value is carried out. It should be noted that, instead of the decrementing, incrementing can be started from a predetermined reload value in the timer register. In the case of incrementing, on the other hand, a pulse is output and, at the same time, the incrementing is resumed from the predetermined reload value as an overflow occurs in the register. Such a scheme will result in the same effect as those provided by the first to fourth embodiments described above.

Figure 6:
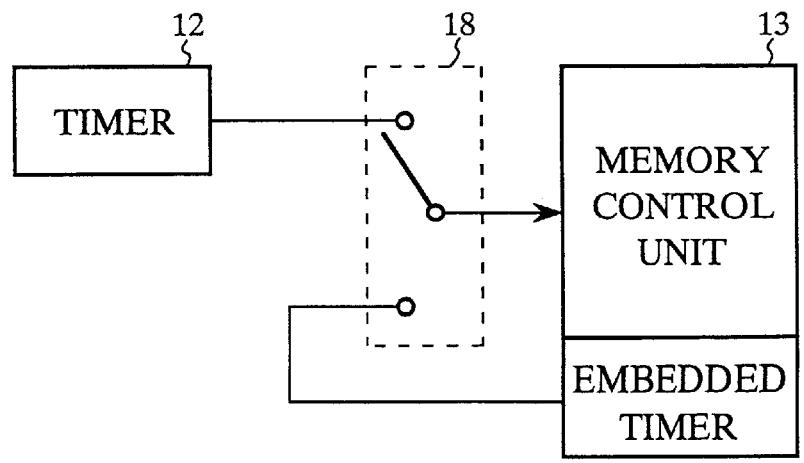
FIG. 6 is a diagram showing a configuration of a microcomputer with an embedded timer already incorporated in a memory control unit thereof during fabrication wherein, even though it is impossible to physically remove the timer, the use of the timer is a selectable option in the implementation of the present invention.
Figure 7:
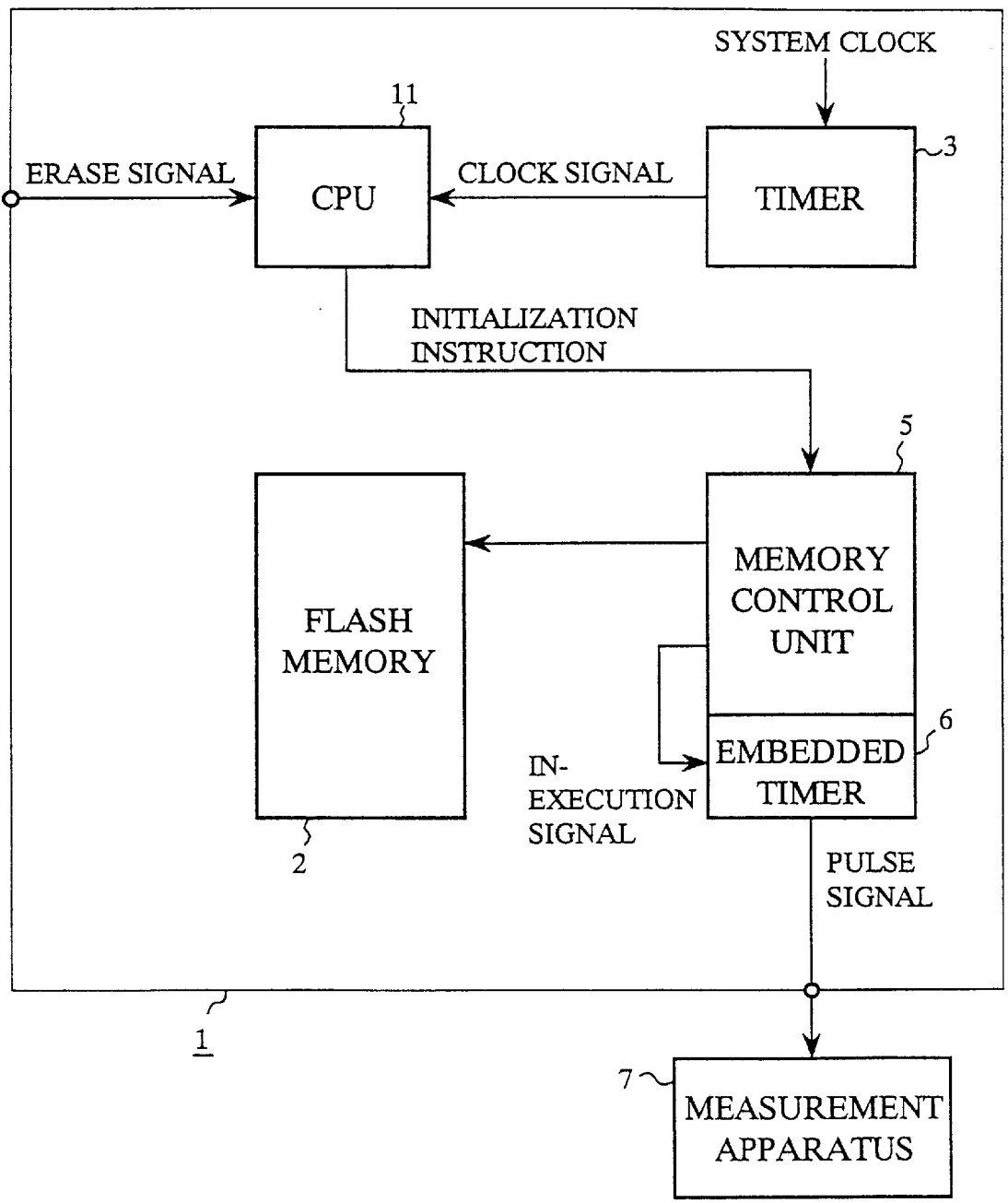
FIG. 7 is a block diagram showing the configuration of the conventional microcomputer.

In addition, in the first to fourth embodiments described above, the embedded timer 6 is eliminated from the memory control units denoted by reference numerals 13, 14, 15 and 17 respectively. If the timer 6 has been embedded in the memory control unit 13, 14, 15 or 17 (during fabrication) and is difficult to take out the embedded timer 6 from the memory control unit 13, 14, 15 or 17, a switch 18 is provided as shown in FIG. 6. The switch 18 is used for properly selecting either the timer 12 or the embedded timer 6 as a generator of pulses to be counted in accordance with the application.

What is claimed is:

1. A microcomputer comprising:
    a CPU for outputting a signal requesting generation of pulses when receiving an erase signal requesting processing to initialize a flash memory unit;
    a timer for generating said pulses when receiving said signal requesting generation of said pulses output by said CPU, said timer dividing the frequency of a system clock to produce clock signals and generating each of said pulses whenever the number of said clock signals reaches a set value to enable the pulse generation to be reduced to a value which is useful for measuring processing times of said initialization of the flash memory unit; and
    a memory control unit for executing said processing to initialize said flash memory unit and for measuring a time it takes to carry out said processing by counting the number of pulses output by said timer when receiving said erase signal.

2. A microcomputer according to claim 1 wherein said timer starts decrementing from a predetermined reload value set in a register thereof in synchronization with said system clock and, as an underflow occurs in said register, one of said pulses is generated and said decrementing is resumed from said predetermined reload value.

3. A microcomputer according to claim 2 wherein said memory control unit changes a reload value set in said timer when said memory control unit receives an instruction to modify said reload value.

4. A microcomputer according to claim 2 wherein said CPU changes a reload value set in said timer when said CPU receives an instruction to modify said reload value.

5. A microcomputer according to claim 1 wherein said timer starts incrementing from a predetermined reload value set in a register thereof in synchronization with said system clock and, as an overflow occurs in said register, one of said pulses is generated and said incrementing is resumed from said predetermined reload value.

6. A microcomputer according to claim 5 wherein said memory control unit changes a reload value set in said timer when said memory control unit receives an instruction to modify said reload value.

7. A microcomputer according to claim 5 wherein said CPU changes a reload value set in said timer when said CPU receives an instruction to modify said reload value.

8. A microprocessor comprising:
    a timer for dividing the frequency of a system clock to produce clock signals and producing a train of pulses, each pulse in said train of pulses being generated every time the number of said clock signals reaches a set value to enable the pulse generation to be reduced to a value which is useful for measuring processing times of said initialization of the flash memory unit, when receiving a signal requesting generation of said pulses; and
    a memory control unit which is used for executing processing to initialize a flash memory unit and for measuring a time it takes to carry out said processing by counting the number of pulses output by said timer after outputting said signal requesting generation of said pulses to said timer when an erase signal requesting said processing is received.

9. A microcomputer according to claim 8 wherein said timer starts decrementing from a predetermined reload value set in a register thereof in synchronization with said system clock and, as an underflow occurs in said register, one of said pulses is generated and said decrementing is resumed from said predetermined reload value.

10. A microcomputer according to claim 8 wherein said timer starts incrementing from a predetermined reload value set in a register thereof in synchronization with said system clock and, as an overflow occurs in said register, one of said pulses is generated and said incrementing is resumed from said predetermined reload value.

11. A microcomputer comprising:
    a CPU for outputting a signal requesting generation of pulses when receiving an erase signal requesting processing to initialize a flash memory unit;
    a memory control unit for executing said processing to initialize said flash memory unit and outputting a busy signal for indicating that said processing is under way when receiving said erase signal; and
    a timer for dividing the frequency of a system clock to produce clock signals, producing each of said pulses every time the number of said clock signals reaches a set value to enable the pulse generation to be reduced to a value which is useful for measuring processing times of said initialization of the flash memory unit and for measuring a time it takes to carry out said processing to initialize said flash memory unit by counting the number of said pulses as long as said busy signal output by said memory control unit is active when said signal requesting generation of said pulses is received from said CPU.

12. A microcomputer according to claim 11 wherein said timer starts decrementing from a predetermined reload value set in a register thereof in synchronization with said system clock and, as an underflow occurs in said register, one of said pulses is generated and said decrementing is resumed from said predetermined reload value.

13. A microcomputer according to claim 11 wherein said timer starts incrementing from a predetermined reload value set in a register thereof in synchronization with said system clock and, as an overflow occurs in said register, one of said pulses is generated and said incrementing is resumed from said predetermined reload value.

14. A microcomputer comprising:
   a memory control unit for executing processing to initialize a flash memory unit and outputting a busy signal for indicating that said processing is under way after outputting a signal requesting generation of pulses when receiving an erase signal requesting said processing;
   a timer for dividing the frequency of a system clock to produce clock signals, producing each of said pulses every time the number of said clock signals reaches a set value to enable the pulse generation to be reduced to a value which is useful for measuring processing times of said initialization of the flash memory unit and for measuring a time it takes to carry out said processing to initialize said processing to initialize said flash memory unit by counting the number of said pulses as long as said busy signal output by said memory control unit is active when said signal requesting generation of said pulses is received from said memory control unit.

15. A microcomputer according to claim 14 wherein said timer starts decrementing from a predetermined reload value set in a register thereof in synchronization with said system clock and, as an underflow occurs in said register, one of said pulses is generated and said decrementing is resumed from said predetermined reload value.

16. A microcomputer according to claim 14 wherein said timer starts incrementing from a predetermined reload value set in a register thereof in synchronization with said system clock and, as an overflow occurs in said register, one of said pulses is generated and said incrementing is resumed from said predetermined reload value.

* * * * *